United States Patent [19]

Worcester

[11] 4,012,099
[45] Mar. 15, 1977

[54] ZERO INSERTION FORCE SOCKET

[75] Inventor: John L. Worcester, Walnut Creek, Calif.

[73] Assignee: E-H Research Laboratories, Inc., Oakland, Calif.

[22] Filed: May 1, 1975

[21] Appl. No.: 573,625

[52] U.S. Cl. .......................... 339/75 M; 339/143 R
[51] Int. Cl.² ....................................... H01R 13/54
[58] Field of Search ......... 339/75 M, 143 R, 143 T

[56] References Cited

UNITED STATES PATENTS

| | | | |
|---|---|---|---|
| 3,136,591 | 6/1964 | Just | 339/126 RS |
| 3,430,183 | 2/1969 | Feeser | 339/143 R |
| 3,763,459 | 10/1973 | Millis | 339/75 M |

*Primary Examiner*—Roy Lake
*Assistant Examiner*—Mark S. Bicks
*Attorney, Agent, or Firm*—Flehr, Hohbach, Test, Albritton & Herbert

[57] ABSTRACT

A plug-in zero insertion force type socket for making temporary electrical connection between the leads on a semiconductor device and testing circuitry where each connection between the high density array of semiconductor device leads and testing circuitry is shielded from external radiation to eliminate cross talk and capacitance coupling. Transit time effects on the shielded electrical connections are minimized by providing short electrical connections which include a high density flared array of coaxial leads connecting a multiplanar arrangement of testing circuitry to the socket.

3 Claims, 7 Drawing Figures

ZERO INSERTION FORCE SOCKET

BACKGROUND OF THE INVENTION

The present invention is directed to an improved zero insertion force socket and method therefor.

To determine if a semiconductor device will perform the desired functions with the desired degree of accuracy, a temporary electrical connection is desired between each of the pin leads of the semiconductor device and a testing device. The more complex of semiconductor devices may have as many as 100 pins.

With a greater number of pin leads it is more difficult to provide such temporary electrical connection. There are two problems: the greater insertion-extraction force and increased "cross-talk", or electromagnetic coupling due to the necessarily greater density of the pin leads.

Sockets have been provided, as illustrated by U.S. Pat. No. 3,763,459, which provide a low insertion-force. However these sockets failed to provide any means to shield against "cross-talk". In addition there was no specific provision for minimizing the length of the leads from the socket to the actual sensing units of the testing device in order to prevent both additional cross-talk, and other problems associated with the transit time of high frequency signals over the lead length.

OBJECTS AND SUMMARY OF INVENTION

It is a general object of the invention to provide an improved zero insertion force socket.

It is another object of the invention to provide a socket for testing a semiconductor device having a high-density of pin leads.

A further object of the invention is to prevent "cross-talk" between pin leads of the semiconductor device under test and the respective electrical connections which extend to the testing circuitry.

A further object of the invention is to minimize transit time effects on the electrical leads connecting the socket to the testing circuitry.

In accordance with the above objects, there is provided a zero insertion force socket for accepting an electrical device having a plurality of pin leads. The socket includes a slidable middle plate positioned between a top plate and bottom plate means. Movement of the slidable middle plate causes temporary electrical connection between each of said pin leads and a plurality of jacks within the socket. Electromagnetic shielding is provided to prevent cross-talk or electromagnetic coupling between each of the connections formed by said plurality of pin leads and jacks, and all associated electrical leads.

In addition, a method for the foregoing includes the steps of bending a plurality of conducting tubes into a predetermined form, and affixing the tubes to the bottom plate means to form a predetermined multiplanar configuration in the half-space defined by the bottom plate means and opposite the socket; inserting an insulating sleeve into each of the conducting tubes; and threading an electrical lead from the connector jack through apertures in the conducting top plate, the cam plate, the conducting bottom plate means, and the conducting tubes to connect with circuit boards containing testing circuitry.

The testing circuitry on the circuit boards is often complicated and may require considerable volume of space. The conducting tubes shield the electrical leads which connect the circuit boards with the high density concentration of connector jacks in the socket. By flaring the array of tubes into a multi-planar configuration and thus allowing a high density arrangement of the circuit boards, the required length of the electrical leads is reduced, which reduces the capacitance coupling between these leads, and minimizes transit time of signals over the lead length.

DESCRIPTION OF THE PREFERRED EMBODIMENT

Figure 1:
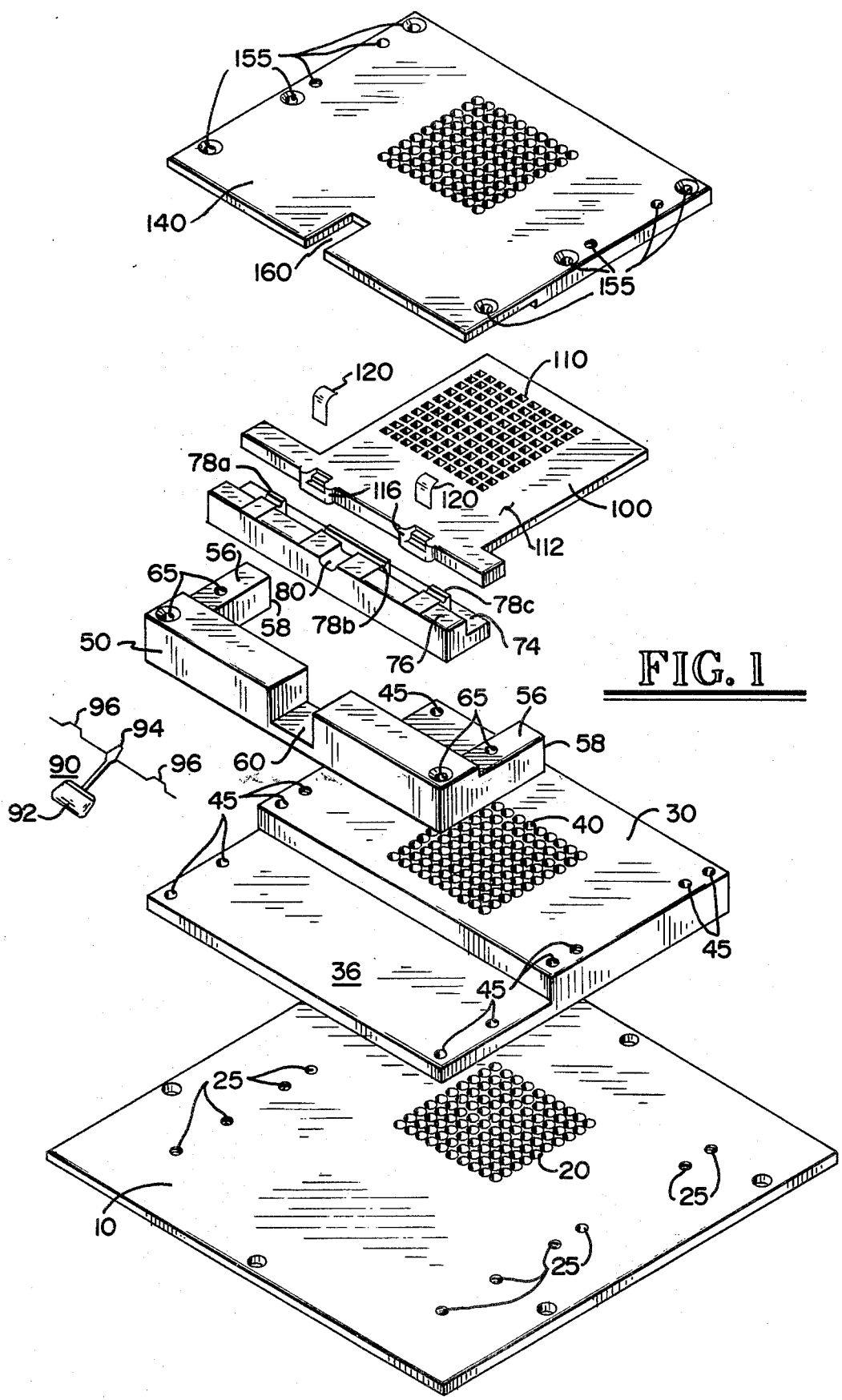
FIG. 1 is an exploded view of the socket of the present invention with certain components eliminated.

Referring to the exploded view of FIG. 1, the socket of the present invention includes bottom plate means comprising base plate 10 and bottom plate 30, end plate 50, cam or middle plate 100 and top plate 140. The square metal base plate 10 contains a matrix of apertures 20; typically a 10 × 10 square matrix. Additional apertures 25 are located in base plate 10 for aligning the additional plates above and adjacent to base plate 10. Alignment holes 25 are also used to receive screws to join together tightly the plates to form the socket.

Square metal bottom plate 30 has a flat bottom face and an upper face composed of two split level rectangular surfaces 34, 36 which are split by a front facing surface 38. In the large elevated surface 34 a matrix of apertures 40 is located which correspond to apertures 20 of base plate 10. Additional apertures 45 are located in bottom plate 30 which correspond with apertures 25 in base plate 10.

End plate 50 is substantially U-shaped and is positioned on the smaller rectangular upper surface 36 of bottom plate 30. The longer, central section 54 of the end plate 50, is a rectangular solid, with a midchannel 60 extending through section 54 from the front surface to the rear surface. Two arms 56 a, b of end plate 50 abut surface 38 and have top surfaces slightly elevated above surface 34 of bottom plate 30. End plate 50 contains several apertures 65 which correspond with certain of apertures 45, 25 in the bottom plate 30 and the base plate 10, respectively.

Between the arms 56 a, b of end plate 50 is positioned a cam pusher 70 which rests upon the surface 36 of bottom plate 30. Cam pusher 70 is composed of plastic and is essentially an L-shaped rectangular solid. There are two principal top surfaces 74, 76, one surface 76 being more elevated than the other surface 74. The more elevated surface 76 has a cross channel 80 which aligns with the center of channel 60 in end plate 50.

Three U-shaped co-linear sections 78 a, b, c extend from the lower surface 74 and form a channel for receiving a lever 90, which is parallel with the longitudinal direction of the cam pusher 70.

Lever 90 has two cam actuating surfaces 96 positioned between the three elevated sections 78. When rotated by a lever handle 92, cam plate 100 is actuated.

Cam plate 100 is composed of plastic or electrical insulating material similar to cam pusher 70 and slidably rests on surface 34 of middle plate 30. The plate includes square section 112 which contains a matrix of square apertures 110, typically a 10 × 10 square matrix, which corresponds to apertures 20 and 40, and a narrow section 114 which is juxtaposed opposite cam pusher 70. Two protuberances 116 are juxtaposed opposite cam actuating surfaces 96 of lever 90. Cam friction wear plates 120, each consisting of a right-angled piece of metal, are positioned on protuberances 116. When lever handle 92 is fully lowered, cam actuating surfaces 96 touch inserts 120 and cause sliding motion of cam plate 100.

Top plate 140 is composed of metal with a flat upper face containing a matrix of apertures 150. Two thicker sections on the bottom surface of top plate 140 (not shown) bridge cam plate 100 and rest directly on bottom plate 30 to space top plate 140 above and out of contact with cam plate 100. Apertures 155 in the top plate 140 align with corresponding apertures 65, 45, and 25 to juxtapose matrix 150 opposite matrix 110.

Alignment holes 25, 45, 65, 155, secure the various parts together, such that only lever 90 and cam plate 100 can move with respect to top plate 140. Rectangular slot 160 directly above channel 60 and channel 80 allows lever handle 92 to be raised above top plate 140.

Figure 2A:
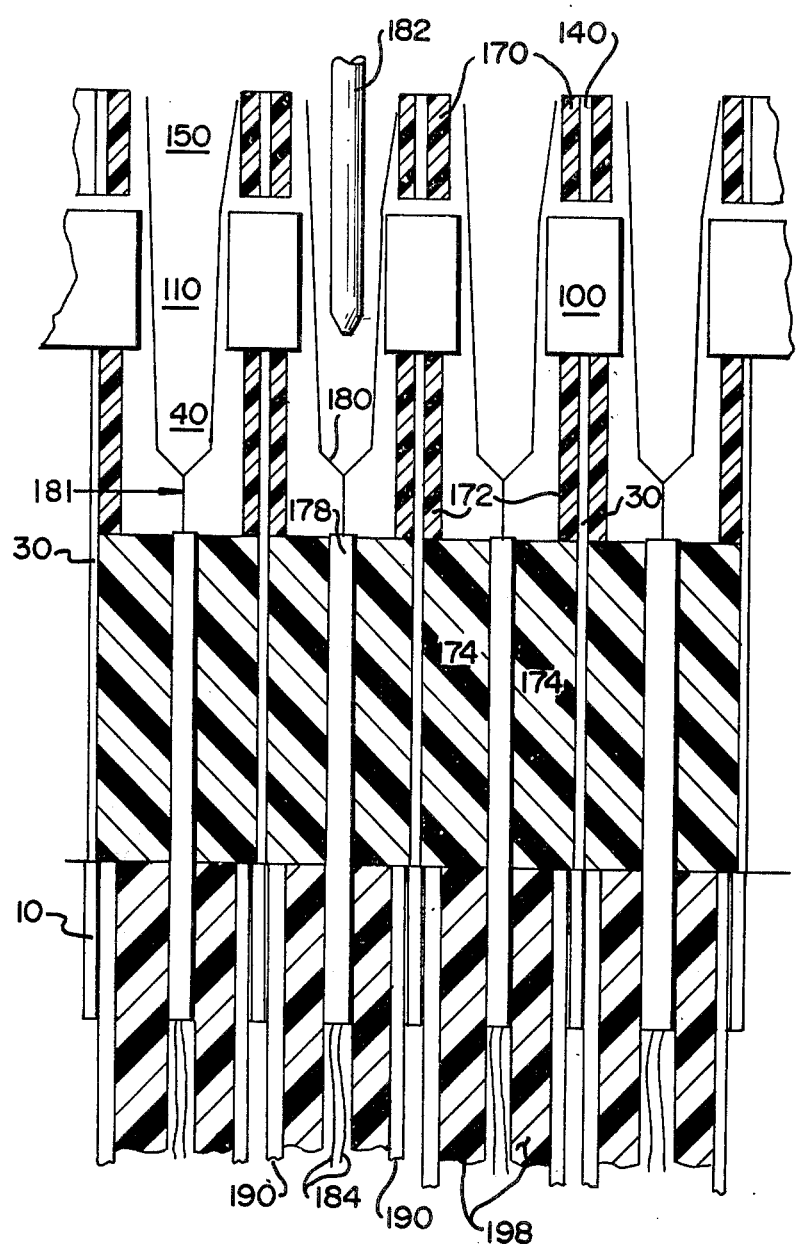
FIG. 2A is a cross-sectional view of a typical group of connectors within the socket of FIG. 1, with the cam plate in an "open" position.

FIG. 2A is a cross-sectional view of a typical set of apertures. Top plate 140, cam plate 100, bottom plate 30, and base plate 10 when joined together align the respective matrices of apertures 150, 110, 40, 20 to form a clear path through all of the plates. The apertures in the matrices in top plate 140, bottom plate 30, and base plate 10 are typically circular. A cylindrical plastic insulator sleeve 170 is fitted inside each aperture in matrix 150 in top plate 140 and two cylindrical plastic insulator sleeves 172, 174 are fitted inside each aperture in matrix 40 in bottom plate 30.

Connector jack 181 includes a copper sleeve 178 which has two prongs 180 affixed to it at one end and extending from the other end the conducting electrical leads 184. Sleeve 178 is force fitted into sleeve 174. Prongs 180 extend upward through the apertures 110 in cam plate 100 and the apertures 150 in top plate 140. In the "open" position, there is sufficient space between prongs 180 for insertion of a pin lead 182 of a semiconductor device without contacting either prong. Thus, frictionless insertion of a multiple lead device into jacks 181 may be effected.

Figure 2B:
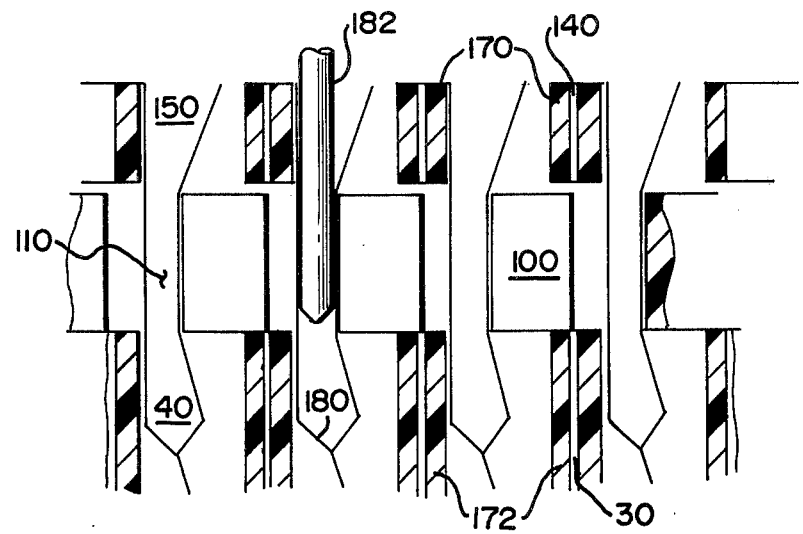
FIG. 2B is a partial cross-sectional view similar to FIG. 2A with the cam plate in a "closed" position.

When the cam lever handle 92 is lowered, cam plate 100 will slide to the left into the "closed" position as depicted in FIG. 2B. This forces prongs 180 to close with respect to each other, and to contact pin lead 182. Thus, electrical contact is made between each pin lead 182 of a multiple lead device and each connector jack 181.

Figure 3:
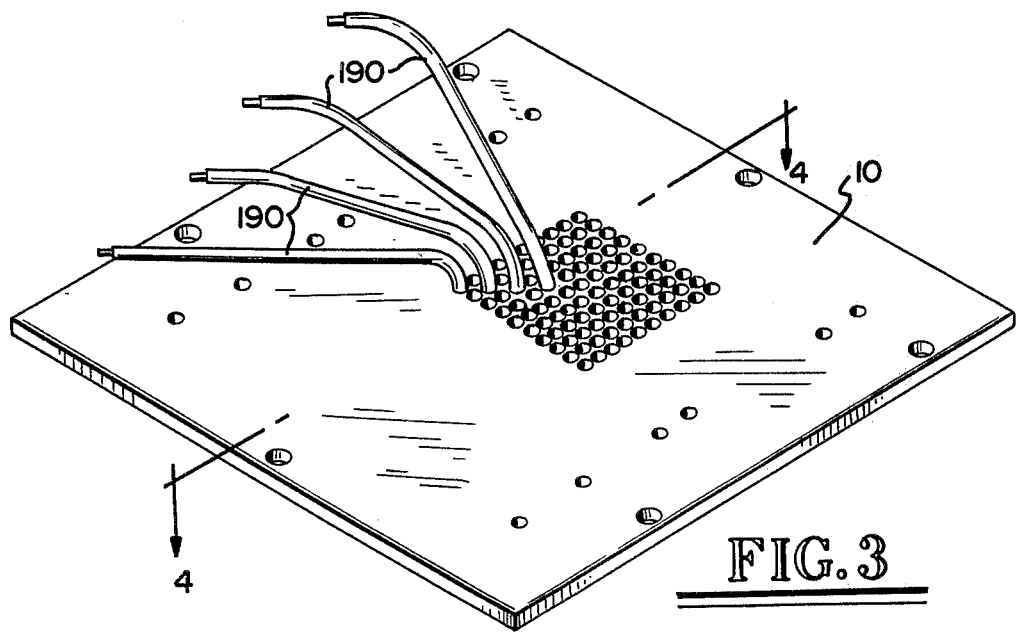
FIG. 3 is a partial perspective view of a portion of FIG. 1.

As shown in FIG. 2A, affixed to and extending from each aperture within matrix 20 of base plate 10 is a cylindrical conducting tube 190. FIG. 3 shows the bottom side of base plate 10 and a portion of tubes 190. The bottom plate means is separated, in the preferred embodiment, into bottom plate 30 and base plate 10 to allow tubes 190 to be affixed more conveniently.

Figure 4:
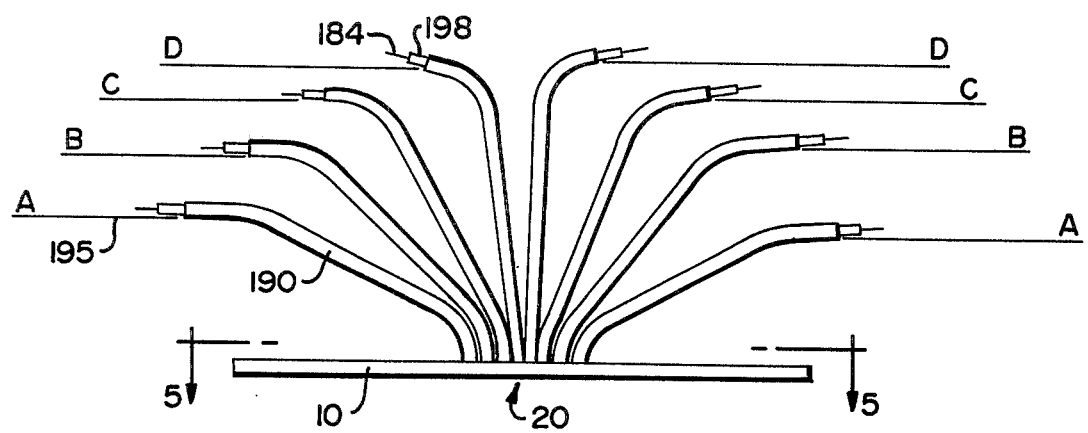
FIG. 4 is a cross-sectional view of the base plate and a typical selection of the tubes taken along the line 4—4 of FIG. 3.
Figure 5:
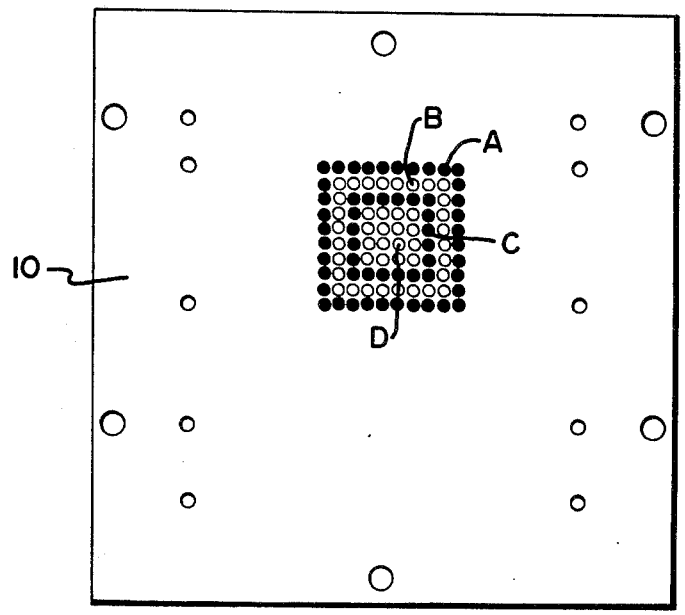
FIG. 5 is a cross-sectional view taken along the line 5—5 of FIG. 4.

As shown in FIG. 2A, electrical leads 184 for each jack 181 pass through tubes 190. A plastic insulating tube 198 is located inside each conducting tube 190. This insulates the electrical leads 184 from the conductor tube 190, and physically positions the conductor pair 184 in the center of tube 190 in order to optimize the transmission line characteristics thereof. Tubes 190 are arranged in a configuration which extends electrical leads 184 into a predetermined number of planes which are parallel with the surface of base plate 10. In the preferred embodiment four parallel planes are chosen which are designated in FIG. 4 by the letters A, B, C, and D. There are thus four planes to which the tubes 190 extend and in which they terminate. FIG. 5 shows the correlation between the apertures in matrix 20 of the base plate 10 and planes A, B, C, D to which their respective tubes 190 extend. To each of the apertures designated by the letter A is affixed a tube 190 which extends to plane A. Similarly, to those apertures designated by the letters B, C, D, are affixed tubes 190 which extend to respective planes B, C, D. By this means, a high density concentration of electrical leads 184 passing through apertures in matrix 20 in the base plate 10 is distributed in a three-dimensional, multi-planar distribution in the half space defined by base plate 10. In planes A, B, C, D circuit boards 195 are affixed to coaxial conductors formed by the tubes 190 and electrical leads 184.

The socket of the present invention is constructed principally of metal, and so each individual connector jack is electrically shielded from electromagnetic radiation emanating from adjacent connector jacks. The only region where coupling may take place is in that space occupied by the cam plate 100. The thickness of cam plate 100 is minimized to diminish the possibility of "cross-talk" between the various connector jacks 181. The effective shielding of each jack 181 allows for a high density arrangement of connector jacks 181 without a loss in resolution of electrical signal from the connections. As each electrical lead 184 emerges from the shielded region which is provided by the metallic plates, it passes through tubes 190 whose metallic conductance shields the electrical leads 184 from "cross-talk" with other leads 184 and from external radiation. The flaring or diverging of the coaxial conductor 184, 190 into multiple planes to connect with circuit boards 195, further reduces the possibility of significant interference from electromagnetic radiation from adjacent electrical leads 184. Also the multi-planar termination of the coaxial conductors minimizes their length which reduces electrical interference either by crosscoupling or from an external source of radiation, and minimizes transit time of signals on electrical leads 184.

Figure 6:
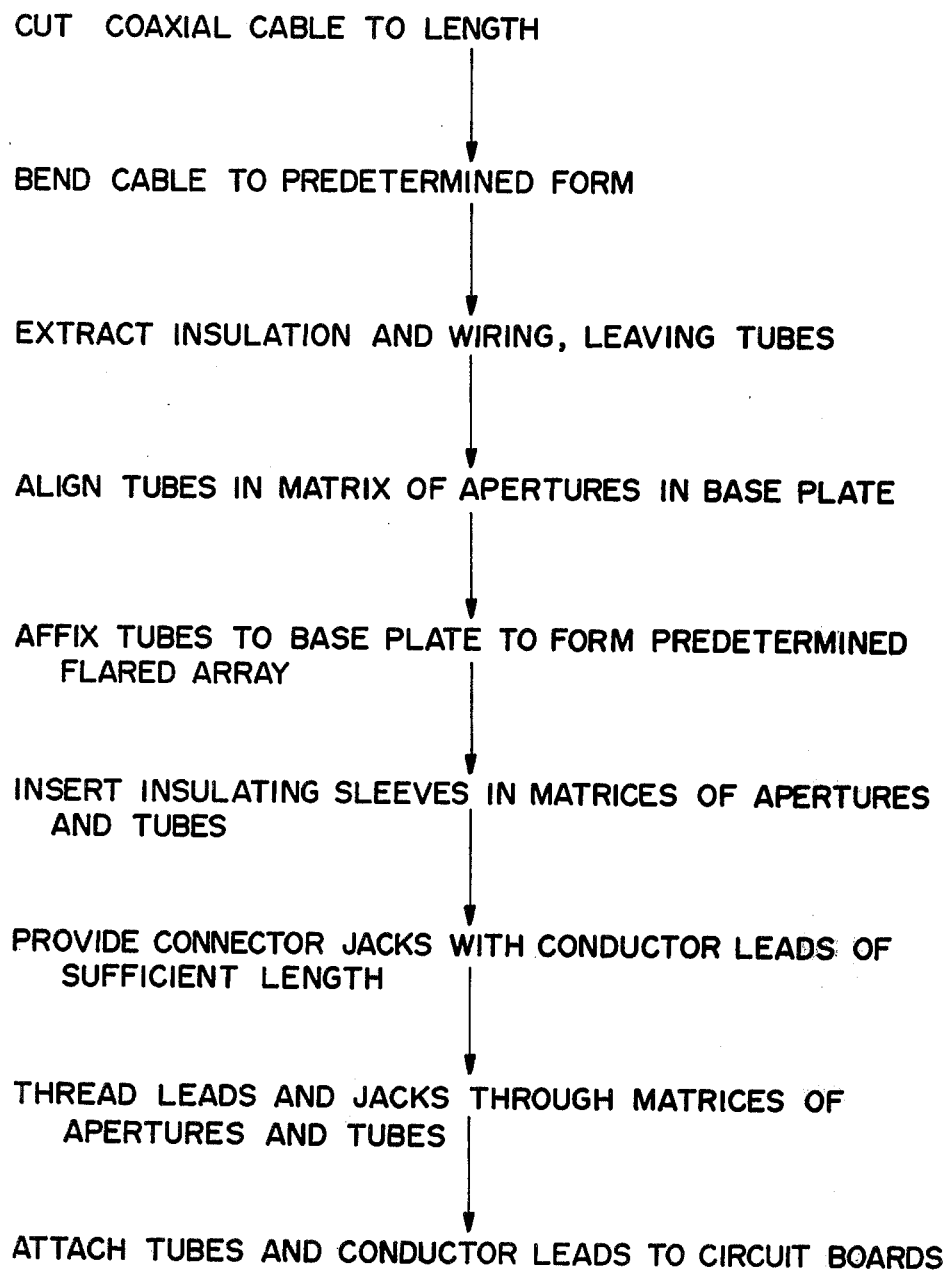
FIG. 6 is a chart showing the various steps involved in the method of manufacturing the preferred embodiment.

The method for constructing the socket allows for a plurality of conducting leads to pass through the socket by inserting insulating sleeves into the apertures in the matrices of the conducting top plate and the conducting bottom plate means, through which the conducting leads pass. The conducting leads are electrically connected to a plurality of circuit boards containing testing circuitry. To minimize the required length of these leads, and to shield them from cross-talk and external radiation, they pass through a flared array of conducting tubes to connect with a multi-planar distribution of the circuit boards. As shown in FIG. 6 the method for constructing the flared array of conducting tubes including bending a plurality of conducting tubes into predetermined forms, extracting the pre-existing insulation therein which has provided structural support, realigning one such tube in each of the apertures in the matrix in the base plate, and firmly affixing these tubes to the base plate to form a flared array in the half-space defined by the base plate and opposite the socket, so that the tubes terminate in a predetermined number of planes which are parallel with the base plate. Insulating sleeves are inserted through the conducting tubes and into the base plate. These sleeves insulate the conducting leads from the conducting tubes, and center these leads in the tubes, to optimize the high impedance transmission line characteristics of the tubes and leads. The method further includes providing a connector jack with a conducting lead of sufficient length to extend through both the socket and the conducting tubes, and threading one such conducting lead through each set of insulated apertures in the matrices in the socket plates and through the insulated conducting tubes. The terminations of the tubes are attached to circuit boards to which the jacks can be electrically connected by means of the conducting leads.

Thus the present invention has provided an improved zero insertion force socket into which a semiconductor device having a high density array of pin leads may be inserted. Each of said pins is protected and shielded from "cross-talk" and other electromagnetic radiation interference from adjacent pins. Electrical connection between the pins and testing circuitry is shielded from "cross-talk" and other electromagnetic radiation interference. The testing circuitry is physically distributed in a multi-planar configuration to separate physically individual electrical connections, and to minimize the length of such connections by providing a high density arrangement of the testing circuitry.

I claim:

1. In a zero insertion force socket for an active electrical device having a plurality of pin leads said socket including bottom plate means with a matrix of apertures through each of which passes a conductor lead terminating in a two pronged connector jack, and a top plate with a corresponding matrix of apertures for receiving said pin leads and juxtaposed opposite said matrix of apertures in said bottom plate means into each of which extends said two pronged connector jack, and a slidable middle plate positioned between said bottom plate means and said top plate with a matrix of apertures correspondingly juxtaposed between said matrices of apertures of said bottom plate and said top plate, each of said jacks being located in a respective aperture of said middle plate and where movement of said slidable middle plate causes each of said two pronged connector jacks to make physical contact and electrical connection with a pin lead inserted through an aperture in said top plate into said jack, the improvement comprising: said top plate and said bottom plate means consisting of electrically conductive material for electromagnetically shielding said conductors and associated connector jacks from each other and said slidable middle plate consisting of insulating material and together with a plurality of tubular conductors having one end affixed to each aperture of said bottom plate means and with said respective conductor leads which terminate in said jacks extending coaxially therethrough, said tubular conductors diverging into the half space defined by said bottom plate means and on the opposite side of said bottom plate means as said top plate, the other end of each of said tubular conductors terminating in a predetermined one of a plurality of planes substantially parallel to said bottom plate means.

2. A socket as in claim 1 together with sleeves of electrical insulating material in said apertures of said top and bottom plates.

3. A socket as in claim 1 including a plurality of circuit boards substantially coplanar with one of said plurality of planes and electrically connected to a coaxial conductor in such plane.

* * * * *